United States Patent
Park et al.

(10) Patent No.: US 7,056,801 B2
(45) Date of Patent: Jun. 6, 2006

(54) RADIO FREQUENCY INTEGRATED CIRCUIT, AND METHOD FOR MANUFACTURING THE SAME

(75) Inventors: Sang Kyun Park, Yongin-Shi (KR); Chan Soo Shin, Daejeon-Shi (KR)

(73) Assignee: Hynix Semiconductor Inc., Ichon ( * ) Notice: Subject to any disclaimer, the term of this patent is extended or adjusted under 35 U.S.C. 154(b) by 45 days.

(21) Appl. No.: 10/878,567

(22) Filed: Jun. 29, 2004

(65) Prior Publication Data
US 2005/0139955 A1    Jun. 30, 2005

(30) Foreign Application Priority Data
Dec. 29, 2003   (KR) .................. 10-2003-0098842

(51) Int. Cl.
*H01L 21/8232*  (2006.01)
*H01L 21/4763*  (2006.01)

(52) U.S. Cl. ............... 438/381; 438/238; 438/622; 336/90

(58) Field of Classification Search ........... 438/238, 438/381, 622, 624
See application file for complete search history.

(56) References Cited

U.S. PATENT DOCUMENTS 6,504,227 B1 *  1/2003  Matsuo et al. .............. 257/531
2004/0063243 A1 *  4/2004  Usami .................. 438/106

* cited by examiner

*Primary Examiner*—Mary Wilczewski
*Assistant Examiner*—Pamela E Perkins
(74) *Attorney, Agent, or Firm*—Mayer, Brown, Rowe & Maw LLP

(57) ABSTRACT

The present invention discloses a radio frequency integrated circuit and a method for manufacturing the same. The radio frequency integrated circuit is manufactured by forming an inductor and a passivation layer on an insulator substrate of a first substrate, forming an element layer having a multi-layer wiring structure on a semiconductor substrate, an inductor coupling line formed on the top portion of the element layer, first and second via contact plugs formed on the inductor coupling line, and an input/output pad coupled to the second via contact plug on a second substrate, and bonding the first substrate onto the second substrate, so that the inductor of the first substrate can be coupled to the first via contact plug of the second substrate. As a result, the radio frequency integrated circuit includes the inductor having a high Q value, by forming the inductor sufficiently separately from the semiconductor substrate on which the elements have been formed.

12 Claims, 2 Drawing Sheets

RADIO FREQUENCY INTEGRATED CIRCUIT, AND METHOD FOR MANUFACTURING THE SAME

BACKGROUND

1. Field of the Invention

The present invention relates to a radio frequency integrated circuit, and a method for manufacturing the same, and more particularly to, a radio frequency integrated circuit which can minimize a parasitic capacitance by sufficiently increasing a distance between a semiconductor substrate on which elements have been formed and an inductor, and a method for manufacturing the same.

2. Discussion of Related Art

According to paradigm variations of information and communication fields, there are increasing demands for communications which can be performed irrespective of time and places. Wireless mobile communication fields have been rapidly developed, satisfying such demands. Radio frequency resources, and materials, devices and circuits operated at a radio frequency are required due to the development of the wireless communication. The radio frequency resources, materials, devices and circuits are used in a radio frequency domain, and thus classified into radio frequency components and integrated circuits.

The radio frequency integrated circuit technology includes combinations of a device manufacturing technology, a circuit design technology and a radio frequency package technology. A competitive RF CMOS can be developed by equally improving each technology. Especially, researches on reduction of production unit cost are essential. For this, a low-priced RF-CMOS technology needs to be developed to reduce a process unit cost by simplifying and stabilizing the whole process. The main components of the RF-CMOS or Bipolar/BiCMOS include an RF MOSFET, an inductor, a varactor, an MIM capacitor and a resistor. However, in both the RF-CMOS and the Bipolar/BiCMOS, the inductor has a low quality factor (hereinafter, referred as 'Q'). In order to increase the Q value of the radio frequency inductor, there has been suggested a method for thickly depositing a low resistance metal except for the device shape. The Q value of the inductor is varied by a number of turns, a width of metal lines, a thickness of the metal lines, an interval between the metal lines, a radius and a shape.

The general guide lines for the design of the inductor will now be described.

1) An interval between metal lines must be minimized. Here, a Q value can be increased by minimizing an inductor area and maximizing mutual inductance.

2) In the case of a multi-layer metal wiring structure, the inductor must be installed on a top metal layer, to minimize a parasitic capacitance to a substrate.

3) The metal lines must be formed as wide and thick as possible. That is, low serial resistances must be obtained. However, if a width of the metal lines excessively increases, the inductor area increases, which results in a high parasitic capacitance and substrate loss. Therefore, proper conditions must be made.

4) A hollow inductor must be implemented, to reduce a negative mutual coupling effect. An inner diameter of the inductor must be five times as large as the width of the metal lines.

5) If a number of turns increases, the inductor area also increases, to facilitate a resistance effect. Here, the parasitic capacitance increases, to reduce the Q value. Accordingly, proper conditions for the number of turns must be made.

In addition to the above five conditions, a method for inserting a trench below an inductor and increasing a thickness of an insulation layer or inserting an earth plate has been investigated due to decoupling.

A conventional method for forming an inductor on a device uses a thick single layer metal line having a thickness of 2 to 6 μm to reduce a resistance element of an inductor metal, or forms an inductor on a lower metal line layer to be in parallel to the upper portion, and couples the inductor through a via hole. However, a Q value obtained by the single layer metal inductor is limitative. In order to form a thicker metal inductor, a number of processes increases, and process failure occurs due to increase of entire height topology. That is, it is difficult to form the thicker metal inductor on an on-chip. In addition, a method for forming an inductor according to the MEMS technology has been suggested. It is a double exposure method for forming a thick single photoresist layer, and patterning about 50 μm of dip via hole coupled to a lower layer metal line and an inductor at the same time. However, the structure and properties of the inductor are deteriorated during a process for forming a uniform depth of inductor lines by double exposure or a process for forming a passivation layer after removing the photoresist layer. As a result, researches have been made on the guide lines for the design of the inductor and the method for overcoming decoupling.

Before discussing the technical objects of the present invention, the 3D integration technology necessary for the present invention will now be briefly explained.

A lot of researches and developments have been concentrated on miniaturization of micro-electronic systems because of world-widely accelerated international technical competitions. A chip scale packaging, a flip chip and a multi-chip module have been generally applied to a variety of electronic products such as mobile phones, hand-held computers and chip cards. A very complicated device having various functions is required for the future electronic system. A chip area sharply increases to satisfy such demands. It implies a yield problem by integration of the multifunctional device, large expenses by complexity of the device, and technical limits. In addition, wiring between sub systems has limits due to performance, muti-functions and reliability of the micro-electronic system. Such factors are regarded as critical performance bottlenecks of the future IC generation. The 3D integration technology is excepted as the technology of highest potentiality which can replace an embedded system on chip technology.

SUMMARY OF THE INVENTION

According to one of the guide lines for applying passive components to a radio frequency integrated circuit such as an RF-CMOS, Bipolar/SiGe and BiCMOS, in the case of a multi-layer metal wiring structure, an inductor must be formed on a top metal layer in order to minimize a parasitic capacitance to a substrate. In addition, a trench is inserted into the inductor and a thickness of an insulation layer is increased so as to overcome decoupling. The present invention is directed to a radio frequency integrated circuit which can minimize a parasitic capacitance by sufficiently increasing a distance between a semiconductor substrate on which elements have been formed and an inductor, by forming the inductor on a special substrate according to a chip scale integrated process (CIP) which is a 3D integration technology, and bonding the substrate onto another substrate on which the logic elements have been formed, and a method for manufacturing the same.

One aspect of the present invention is to provide a radio frequency integrated circuit including: a first substrate having an inductor exposed on one side of an insulator substrate, and a passivation layer formed on the other side of the insulator substrate; and a second substrate having an element layer formed on a semiconductor substrate with a multi-layer wiring structure, an inductor coupling line formed on the top portion of the element layer, and contact plugs formed on the inductor coupling line, the inductor and the via contact plugs being electrically connected by bonding the first substrate onto the second substrate.

According to another aspect of the present invention, a method for manufacturing a radio frequency integrated circuit includes the steps of: manufacturing a first substrate by the sub-steps of: forming a seed layer and a sacrificial protection film on one side of an insulator substrate; forming inductor patterns by partially etching the insulator substrate to expose the seed layer; forming an inductor by filling an inductor formation material in the inductor patterns; forming a passivation layer on the other side of the insulator substrate; and removing the sacrificial protection film and the seed layer; manufacturing a second substrate by the sub-steps of: providing a semiconductor substrate on which an element layer has been formed; forming an inductor coupling line on the element layer; forming an interlayer insulation layer over the resulting structure including the inductor coupling line; forming first and second via contact plugs coupled to the inductor coupling line, by partially etching the interlayer insulation layer and filling a conductive layer; and forming an input/output pad coupled to the second via contact plug on the interlayer insulation layer; and bonding the first substrate onto the second substrate.

Here, the insulator substrate is formed at a thickness of 10 to 100 μm by using an insulator, such as a transparent and easily-handled glass, a compound containing the glass and other elements, a plastic similar to the glass, silicon and a polymer compound.

The seed layer is formed by using one metal selected from the group consisting of TiW, Ta, Cu, TiN, TaN, WN, Ni, Ag, Au, Co, Ti and Al, a mixture thereof, or an alloy thereof.

The sacrificial protection film is formed at a thickness of 500 to 10000 Å by using a silicon oxide film group.

The inductor is formed by using one metal selected from the group consisting of Cu, Au, Ag, Ni, Co, Al and W.

The inductor is formed according to a plating method using the seed layer.

The passivation layer is formed at a thickness of 3000 to 30000 Å as the stacked structure with SiN, SiC or $SiO_2$.

The sacrificial protection film and the seed layer are removed by using at least one wet etching solution of an HF solution, BOE solution and nitric acid solution.

The inductor coupling line and the via contact plugs are formed by using a material identical or similar to that of the inductor.

The inductor of the first substrate is electrically connected to the first via contact plug of the second substrate.

The first substrate and the second substrate are pressurized, annealed and bonded in a forming gas atmosphere of Ar, $N_2$, $H_2$+Ar or $H_2$+$N_2$. The annealing process is performed at a temperature of 200 to 700° C., and the pressure ranges from 100 to 10000 mbar.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1A:
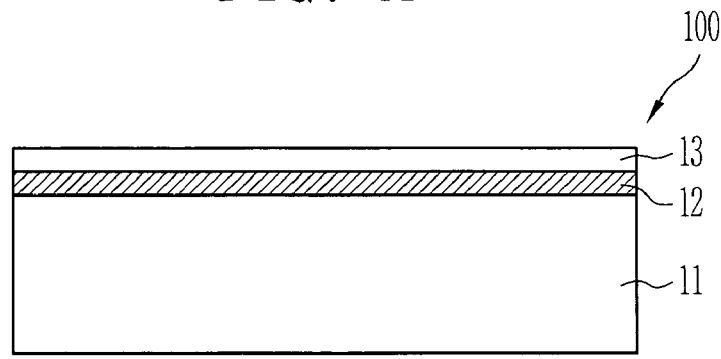
FIGS. 1A to 1C are cross-sectional diagrams illustrating sequential steps of a method for forming an inductor having a passivation layer on a first substrate to explain a method for manufacturing a radio frequency integrated circuit in accordance with a preferred embodiment of the present invention.

A radio frequency integrated circuit and a method for manufacturing the same in accordance with a preferred embodiment of the present invention will now be described in detail with reference to the accompanying drawings.

In the case that it is described that one film is disposed 'on' another film or a semiconductor substrate, one film can directly contact another film or the semiconductor substrate, or the third film can be positioned between them. In the drawings, a thickness or size of each layer is exaggerated to provide clear and accurate explanations. Wherever possible, the same reference numerals will be used throughout the drawings and the description to refer to the same or like parts.

Figure 1B:
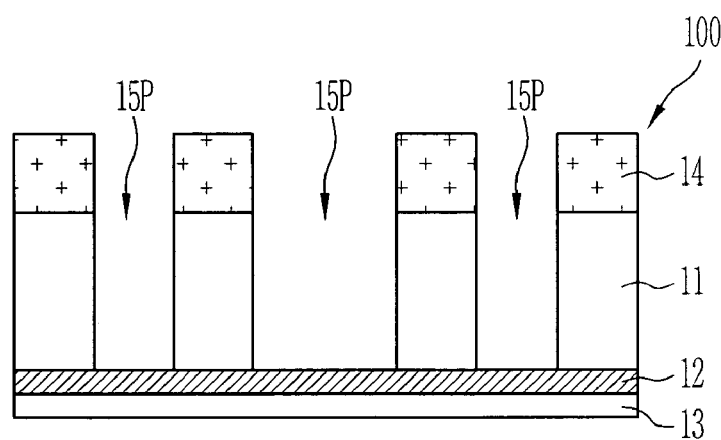
Figure 1C:
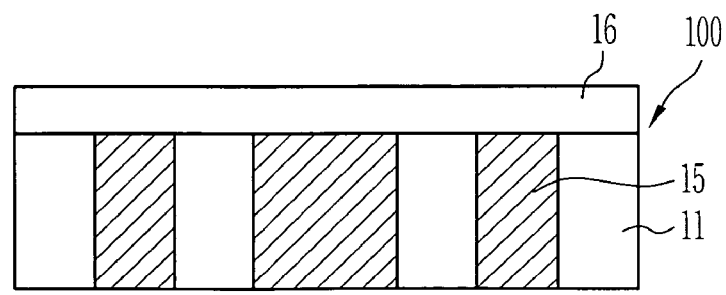

FIGS. 1A to 1C are cross-sectional diagrams illustrating sequential steps of a method for forming an inductor having a passivation layer on a first substrate to explain the method for manufacturing the radio frequency integrated circuit such as an RF-CMOS, Bipolar/SiGe and BiCMOS in accordance with the preferred embodiment of the present invention.

Referring to FIG. 1A, a seed layer 12 and a sacrificial protection film 13 are formed on one side of an insulator substrate 11.

The insulator substrate 11 is formed at a thickness of 10 to 100 μm by using an insulator, such as a transparent and easily-handled glass, a compound containing the glass and other elements, a plastic similar to the glass, silicon and a polymer compound. A size of the insulator substrate 11 is equal to or different from that of a substrate on which elements are formed, which will later be discussed.

The seed layer 12 is formed by using one metal selected from the group consisting of TiW, Ta, Cu, TiN, TaN, WN, Ni, Ag, Au, Co, Ti and Al, a mixture thereof, or an alloy thereof, which have a low resistance to facilitate plating of inductor lines and which are easily removable in an etching solution. The seed layer 12 is formed at a thickness of 50 to 5000 Å according to one of a sputtering method, an evaporation method, a PVD method, a CVD method, an ALD method, an electroplating method and an electroless plating method.

The sacrificial protection film 13 is formed at a thickness of 500 to 10000 Å according to the CVD method by using a silicon oxide film group, so that it can be easily removable in a wet etching solution and can protect the seed layer 12 from external impacts.

As illustrated in FIG. 1B, photoresist patterns 14 for an inductor are formed on the other side of the insulator substrate 11. The insulator substrate 11 is etched to expose the seed layer 12 according to an etching process using the photoresist patterns 14 as an etch mask, thereby forming inductor patterns 15P on the insulator substrate 11. Although not illustrated, the edges of the insulator substrate 11 which become electrical coupling points of the seed layer 12 are opened, and thus the seed layer 12 of these points is also exposed.

As shown in FIG. 1C, the photoresist patterns 14 are removed, and an inductor formation material is filled in the inductor patterns 15P, to form an inductor 15. A passivation layer 16 for protecting the inductor 15 is formed on the insulation substrate 11 including the inductor 15. The sacrificial protection film 13 and the seed layer 12 are removed according to a wet etching process using a wet etching solution, thereby completing a first substrate 100 where the inductor 15 is exposed on one side of the insulator substrate 11 and the passivation layer 16 is formed on the other side of the insulation substrate 11.

The inductor 15 is formed by using one metal selected from the group consisting of Cu, Au, Ag, Ni, Co, Al and W, or an alloy thereof, which are used as the inductor of the semiconductor device. Exemplary processes for filling the conductive material include a general plating process, a selective plating process, a general deposition process and a selective deposition process. Preferably, the inductor 15 is formed according to a selective plating method or a selective electroless plating method using the seed layer 12.

In order to protect the inductor 15 from a wet etching solution or external impacts, the passivation layer 16 is formed at a thickness of 3000 to 30000 Å as the stacked structure with SiN, SiC or $SiO_2$.

The sacrificial protection film 13 and the seed layer 12 are removed by using at least one wet etching solution of an HF solution, BOE solution and nitric acid solution.

Figure 2:
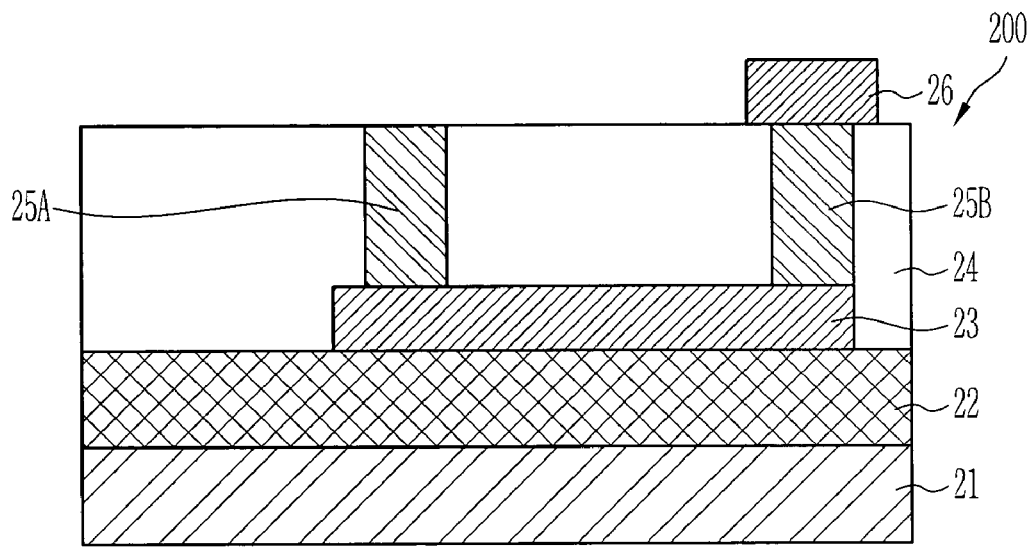
FIG. 2 is a cross-sectional diagram illustrating a method for forming an element layer having a multi-layer wiring structure on a second substrate to explain the method for manufacturing the radio frequency integrated circuit in accordance with the preferred embodiment of the present invention.

FIG. 2 is a cross-sectional diagram illustrating a method for forming an element layer having a multi-layer wiring structure on a second substrate to explain the method for manufacturing the radio frequency integrated circuit such as the RF-CMOS, Bipolar/SiGe and BiCMOS in accordance with the preferred embodiment of the present invention.

Referring to FIG. 2, an element layer 22 is formed on a semiconductor substrate 21 on which a well formation process and an element isolation process have been performed. Here, the element layer 22 implies a layer on which all elements composing the radio frequency integrated circuit are formed. That is, unit elements such as a PMOS transistor and an NMOS transistor are formed according to a gate formation process, a source/drain formation process and a contact process, and metal lines are formed according to a multi-layer metal wiring process. An inductor coupling line 23 is formed on the element layer 22 to implement the inductor 15 of the first substrate 100 on a top metal layer. An interlayer insulation layer 24 is formed over the resulting structure including the inductor coupling line 23. First and second via contact plugs 25A and 25B coupled to the inductor coupling line 23 are formed by partially etching the interlayer insulation layer 24 and filling a conductive layer. An input/output pad 26 coupled to the second via contact plug 25B is formed on the interlayer insulation layer 24, thereby completing a second substrate 200 including the element layer 22 having the multi-layer wiring structure on the semiconductor substrate 21, the inductor coupling line 23 formed on the top portion of the element layer 22, the first and second via contact plugs 25A and 25B formed on the inductor coupling line 23, and the input/output pad 26 coupled to the second via contact plug 25B.

Preferably, the inductor coupling line 23 and the first and second via contact plugs 25A and 25B are formed by using a material identical to that of the inductor 15 of the first substrate 100, but also can be formed by using a similar material. The input/output pad 26 and interconnection pads (not shown) are generally formed by using Al.

Figure 3:
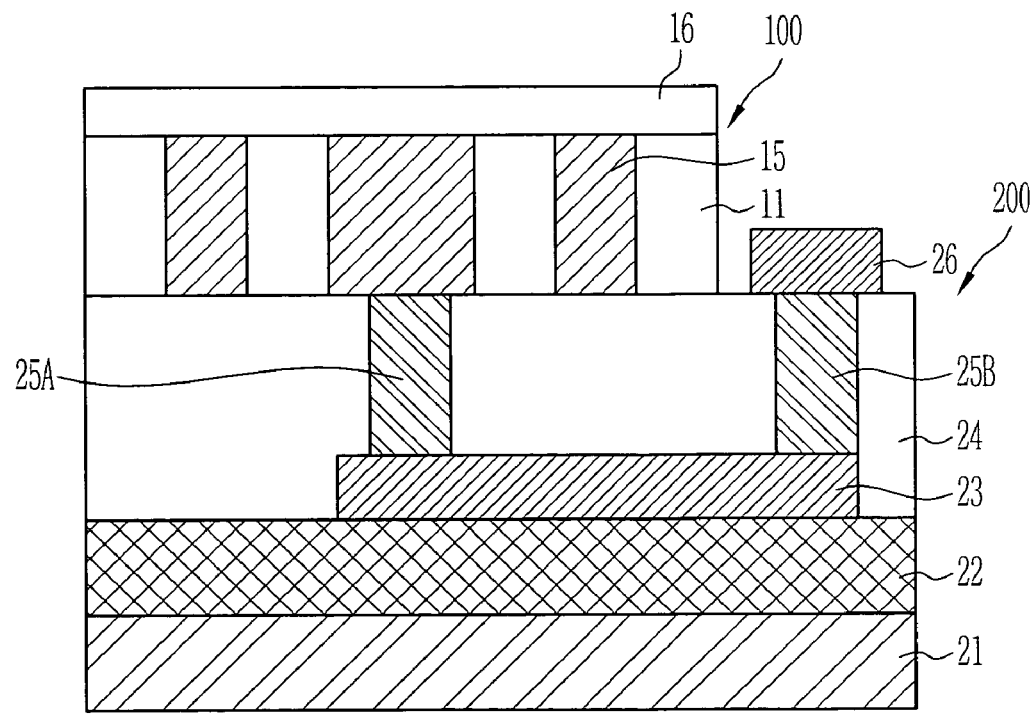
FIG. 3 is a cross-sectional diagram illustrating the radio frequency integrated circuit in which the first substrate of FIG. 1C and the second substrate of FIG. 2 have been bonded.

FIG. 3 is a cross-sectional diagram illustrating the radio frequency integrated circuit in which the first substrate 100 of FIG. 1C and the second substrate 200 of FIG. 2 have been bonded. That is, the radio frequency integrated circuit is manufactured by bonding the first substrate 100 onto the second substrate 200, so that the inductor 15 of the first substrate 100 can be coupled to the first via contact plug 25A of the second substrate 200.

The first substrate 100 and the second substrate 200 are annealed at 200 to 700° C. for 1 minute to 2 hours in a forming gas atmosphere of Ar, $N_2$, $H_2$+Ar or $H_2$+$N_2$. At this time, 100 to 10000 mbar of pressure is applied between the first substrate 100 and the second substrate 200.

The first substrate 100 can be bonded to the second substrate 200 in the same size as the second substrate 200, or to the manual element portion of the second substrate 200 in the form of a unit element chip.

As discussed earlier, in accordance with the present invention, the radio frequency integrated circuit such as the RF-CMOS, Bipolar/SiGe and BiCMOS is manufactured by using the 3D integration technology for forming the substrate including the inductor and the substrate including the elements, respectively, and bonding the two substrates. As a result, the high performance radio frequency integrated circuit minimizes the parasitic capacitance, and includes the inductor having the high Q value, by forming the inductor sufficiently separately from the semiconductor substrate on which the elements have been formed.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for manufacturing a radio frequency integrated circuit, comprising the steps of:
   manufacturing a first substrate by the sub-steps of:
   forming a seed layer and a sacrificial protection film on one side of an insulator substrate;
   forming inductor patterns by partially etching the insulator substrate to expose the seed layer;
   forming an inductor by filling an inductor formation material in the inductor patterns;
   forming a passivation layer on the other side of the insulator substrate; and
   removing the sacrificial protection film and the seed layer;
   manufacturing a second substrate by the sub-steps of:
   providing a semiconductor substrate on which an element layer has been formed;
   forming an inductor coupling line on the element layer;
   forming an interlayer insulation layer over the resulting structure including the inductor coupling line;

forming first and second via contact plugs coupled to the inductor coupling line, by partially etching the interlayer insulation layer and filling a conductive layer; and forming an input/output pad coupled to the second via contact plug on the interlayer insulation layer; and bonding the first substrate onto the second substrate.

2. The method of claim 1, wherein the insulator substrate is formed at a thickness of 10 to 100 μm by using an insulator, such as a transparent and easily-handled glass, a compound containing the glass and other elements, a plastic similar to the glass, silicon and a polymer compound.

3. The method of claim 1, wherein the seed layer is formed by using one metal selected from the group consisting of TiW, Ta, Cu, TiN, TaN, WN, Ni, Ag, Au, Co, Ti and Al, a mixture thereof, or an alloy thereof.

4. The method of claim 1, wherein the sacrificial protection film is formed at a thickness of 500 to 10000 Å by using a silicon oxide film group.

5. The method of claim 1, wherein the inductor is formed by using one metal selected from the group consisting of Cu, Au, Ag, Ni, Co, Al and W, or an alloy thereof.

6. The method of claim 1, wherein the inductor is formed according to a selective plating method or a selective electroless plating method using the seed layer.

7. The method of claim 1, wherein the passivation layer is formed at a thickness of 3000 to 30000 Å as the stacked structure with SiN, SiC or $SiO_2$.

8. The method of claim 1, wherein the sacrificial protection film and the seed layer are removed by using at least one wet etching solution of an HF solution, BOE solution and nitric acid solution.

9. The method of claim 1, wherein the inductor coupling line and the via contact plugs are formed by using a material identical or similar to that of the inductor.

10. The method of claim 1, wherein the inductor of the first substrate is electrically connected to the first via contact plug of the second substrate.

11. The method of claim 1, wherein the first substrate and the second substrate are pressurized, annealed and bonded in a forming gas atmosphere of Ar, $N_2$, $H_2+Ar$ or $H_2+N_2$.

12. The method of claim 11, wherein the annealing process is performed at a temperature of 200 to 700° C., and the pressure ranges from 100 to 10000 mbar.

* * * * *